(12) United States Patent
Faulkner et al.

(10) Patent No.: US 8,707,240 B2
(45) Date of Patent: Apr. 22, 2014

(54) STRUCTURED PLACEMENT FOR BIT SLICES

(75) Inventors: Darren Faulkner, Austin, TX (US); Alan Cheuk-Ming Lam, San Jose, CA (US); Samit Chaudhuri, Cupertino, CA (US); Aditya Shiledar, San Jose, CA (US)

(73) Assignee: Synopsys, Inc., Mountain View, CA (US)

(*) Notice: Subject to any disclaimer, the term of this patent is extended or adjusted under 35 U.S.C. 154(b) by 386 days.

(21) Appl. No.: 12/479,681

(22) Filed: Jun. 5, 2009
(Under 37 CFR 1.47)

(65) Prior Publication Data
US 2010/0011324 A1    Jan. 14, 2010

Related U.S. Application Data

(60) Provisional application No. 61/131,158, filed on Jun. 7, 2008.

(51) Int. Cl.
*G06F 9/455* (2006.01)
*G06F 17/50* (2006.01)

(52) U.S. Cl.
USPC ............ 716/132; 716/119; 716/126; 716/135

(58) Field of Classification Search
USPC .......................................... 716/132
See application file for complete search history.

(56) References Cited

U.S. PATENT DOCUMENTS

| | | | | |
|---|---|---|---|---|
| 5,493,506 A | * | 2/1996 | Sakashita et al. | 716/121 |
| 6,463,568 B1 | * | 10/2002 | Wasson | 716/102 |
| 7,735,051 B2 | * | 6/2010 | Van Huben et al. | 716/104 |
| 2002/0144227 A1 | * | 10/2002 | Das et al. | 716/12 |
| 2006/0090151 A1 | * | 4/2006 | Miller et al. | 716/8 |
| 2006/0267630 A1 | * | 11/2006 | Matsui | 326/41 |

* cited by examiner

*Primary Examiner* — Vuthe Siek
*Assistant Examiner* — Eric Lee
(74) *Attorney, Agent, or Firm* — Blakely, Sokoloff, Taylor & Zafman LLP; Judith A. Szepesi

(57) ABSTRACT

Techniques are disclosed for improving bit slice placement and wiring. Some embodiments include swapping cells to improve routing. An alternative embodiment includes copying wiring from a first bit slice to a second bit slice. Another embodiment includes copying blocks or cells from a first bit slice to a second bit slice. Further, the wiring from the first bit slice may be copied to the second bit slice.

18 Claims, 6 Drawing Sheets

Flow to Replicate Cells From a Bit Slice

FIG. 1A – Pair swapping inside a bit slice (before swap)
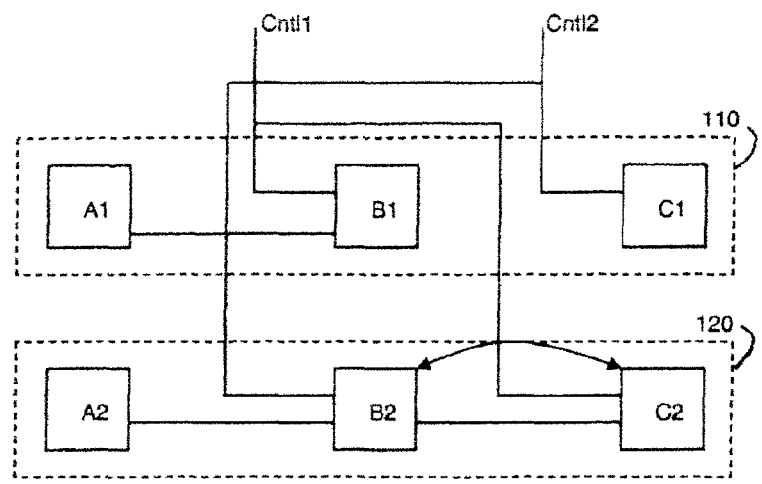
FIG. 1B – Pair swapping inside a bit slice (after swap)
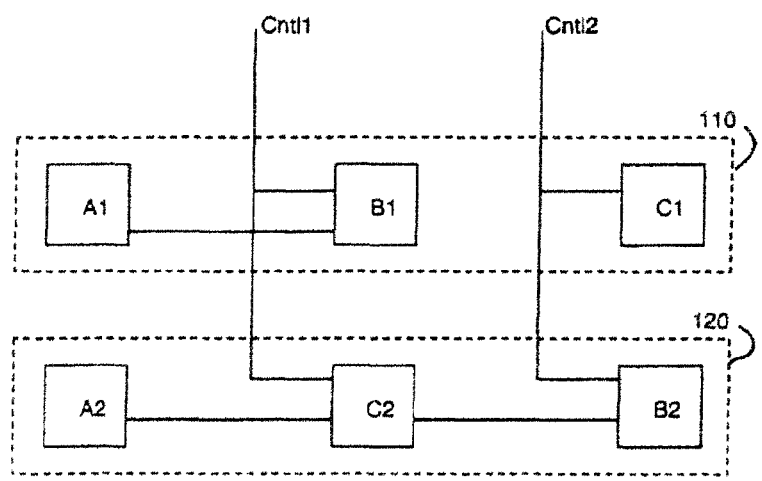

FIG. 2A – Swapping multiple cells (before swap)
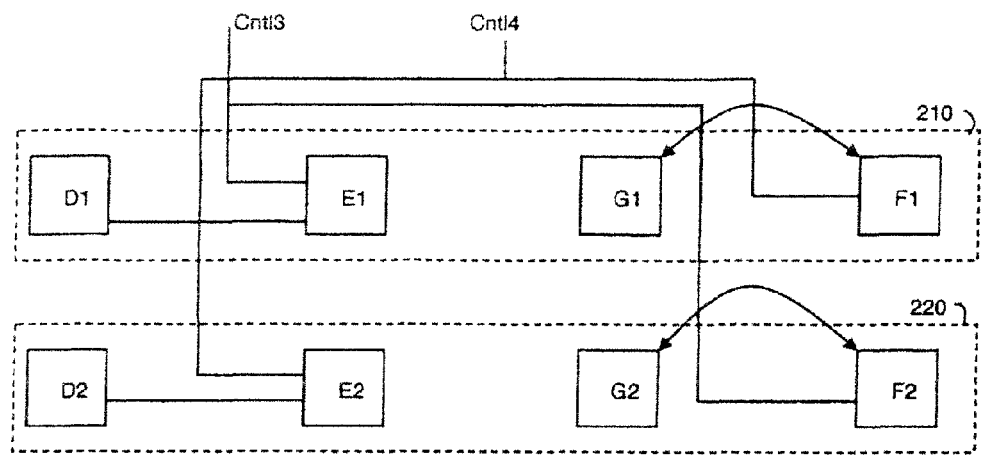
FIG. 2B – Swapping multiple cells (after swap)
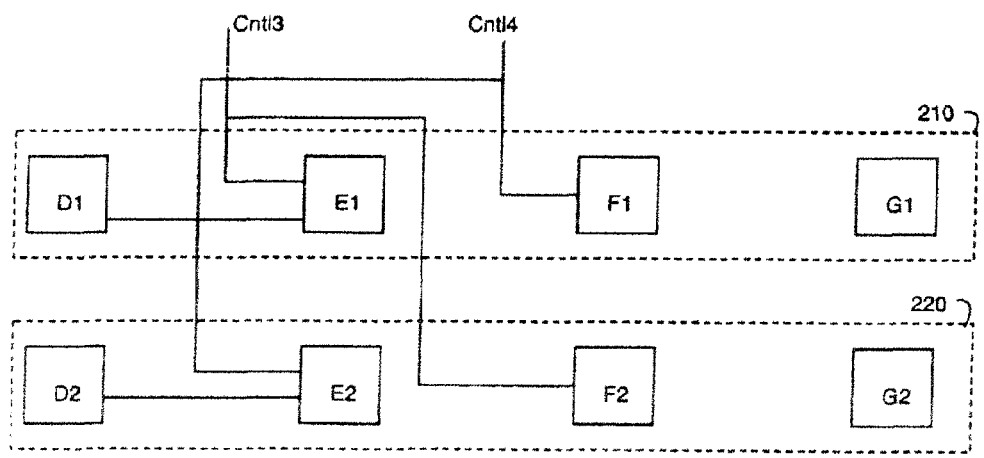

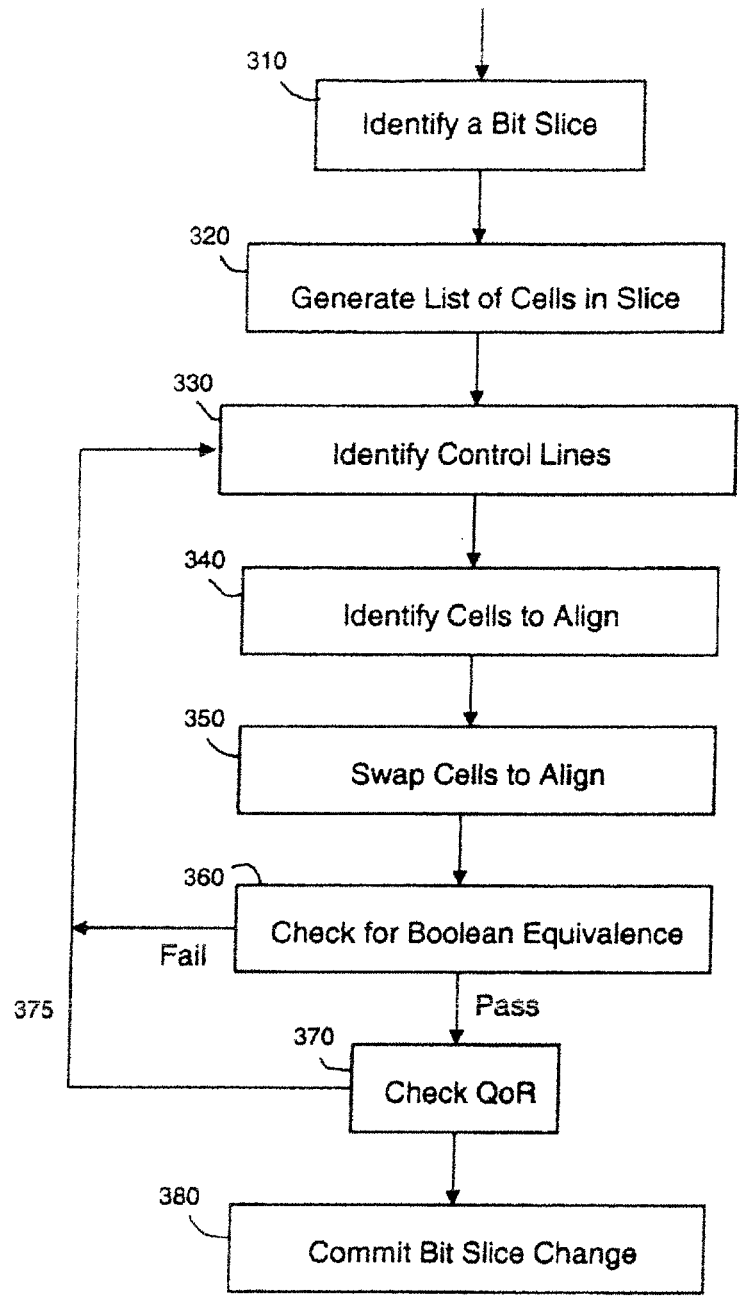
FIG. 3 – Flow for Cell Swapping

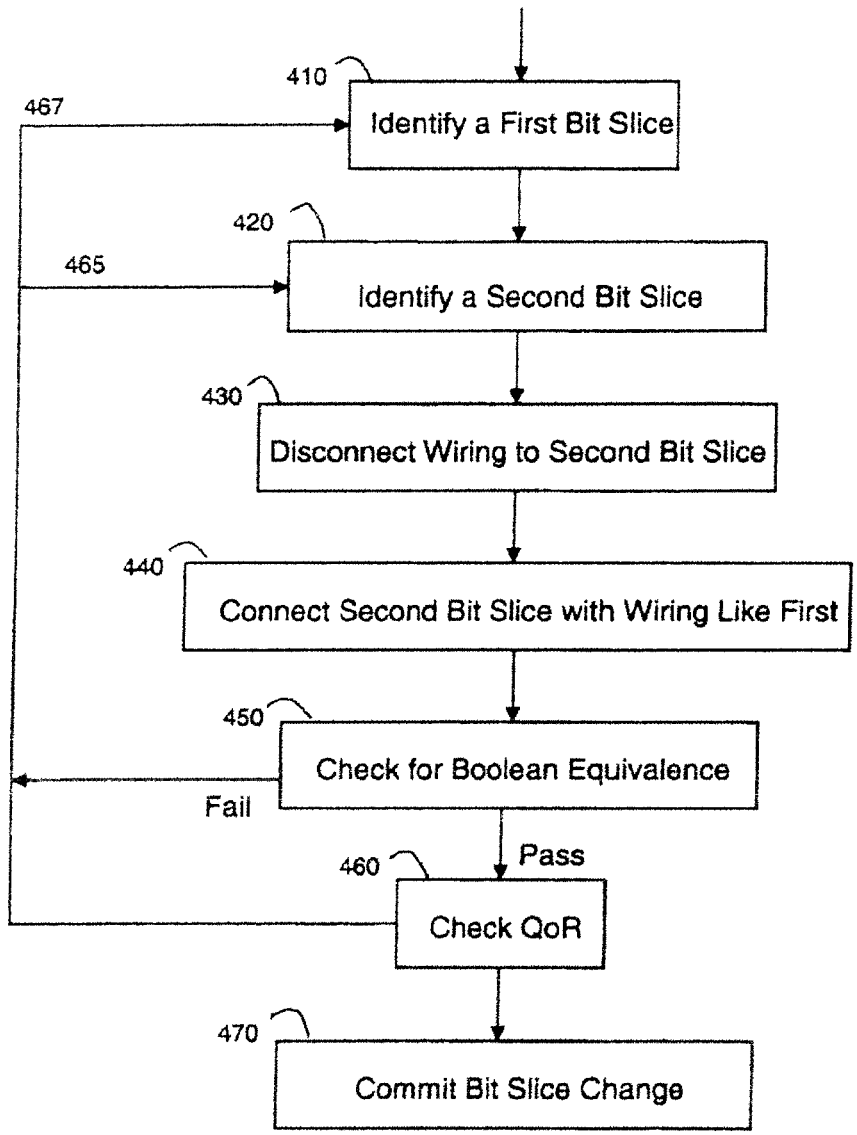
FIG. 4 – Flow to Replicate Wiring of Bit Slice

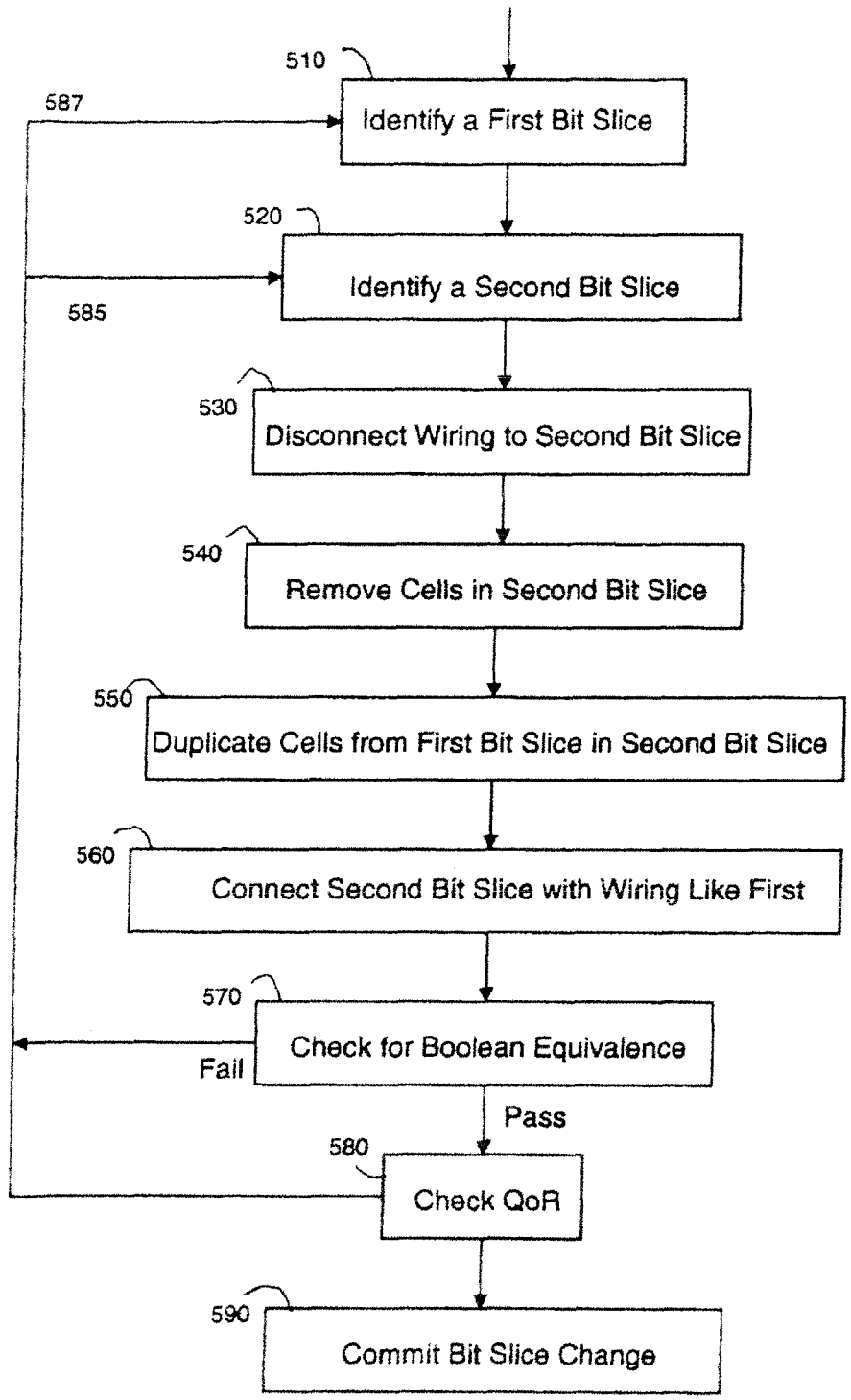
FIG. 5 – Flow to Replicate Cells From a Bit Slice

STRUCTURED PLACEMENT FOR BIT SLICES

PRIORITY

The present application claims priority to and the benefit of the filing date of U.S. Provisional Application No. 61/131,158, filed Jun. 7, 2008, entitled "Structured Placement For Bit Slices."

BACKGROUND

This invention relates generally to the field of chip design and more particularly to placement for bit slice circuitry.

Semiconductor chips are vastly complex arrangements of circuitry, being composed of numerous smaller components. With each successive generation of semiconductor chips, more and more components are incorporated onto a single chip. These components can take the form of hard macros, soft macros, and individual cells or gates. Hard macros are structures with pre-defined, inflexible shapes with on-chip memories being a typical example. Soft macros contain a combination of components, often including smaller hard macros, smaller soft macros, and cells. The components inside a soft macro can be shifted around to optimize the layout of the chip. The cells or gates form the smallest units that provide logical function with examples being NOR gates and flip flops. These cells are fixed in shape but can be moved around as needed and even replicated or cloned to aid in the overall layout, timing, or any other chip parameter that needs to be optimized. These cells can, in turn, be placed in locations that appear to be rather random. The random placement results in the interconnect wiring appearing to be a "rat's nest" on the metallization layers of a chip.

There are certain, well understood soft macro types which do not behave well when composed of rather randomly placed cells with the corresponding rather random interconnect wiring. Examples of these types of macros for which randomness is detrimental include multipliers and register files.

Regularity is beneficial on these types of soft macros. A multiplier is often composed of numerous full-adder cells. By placing the full-adder cells in a very specific, regular arrangement the interconnection between the cells is also very regular. By having regular placement and the resulting regular wiring, timing is predictable and consistent between the various stages. Oftentimes there are pipeline stages where progressive calculations are performed and intermediate results stored. By maintaining regular placement of the pipeline stages, again the interconnect wiring, timing, and other key aspects of the chip design are regular, predictable, and highly optimized.

This type of regular placing of cells is often referred to as structured placement. Historically, structured placement has been manually performed to hand optimize the layout arrangement of the cells. Hand placement has been the only way to avoid the apparently random placement and irregular interconnect that is quite problematical for certain macros. Just identifying which cells need to be regularly placed is itself a perplexing problem. Once identified, correct regular placement of the needed cells via automation is still difficult.

Often, in the midst of this circuitry there are regular, repeated logic structures referred to as bit slices. These bit slices are an arrangement of logic cells. An example of a bit slice may be a group of flip flops that form an address in a register file. Another example of a bit slice may be a group of cells that form a portion of an arithmetic logic unit (ALU). A third example of a bit slice may be a row of full adders that form part of a multiplier unit. Any group of cells which are identical and repeated may be considered a bit slice. Further a group of similar cells which are repeated may be considered a bit slice.

The problem is that a bit slice is regular structure and benefits from regular placement, yet automatically placing of bit slices has not resulted in a regular placement.

BRIEF SUMMARY OF THE INVENTION

Techniques are disclosed for improving bit slice placement and wiring. Some embodiments include swapping cells to improve routing. An alternative embodiment includes copying wiring from a first bit slice to a second bit slice. Another embodiment includes copying blocks or cells from a first bit slice to a second bit slice. Further, the wiring from the first bit slice may be copied to the second bit slice.

BRIEF DESCRIPTION OF THE DRAWINGS

The present invention is illustrated by way of example and not limitation in the figures of the accompanying drawings, in which like references indicate similar elements and in which:

FIG. 1A is an example diagram of two bit slices before cell swapping.

FIG. 1B is an example diagram of two bit slices after cell swapping.

FIG. 2A is an example diagram of two bit slices before a pair of cells is swapped.

FIG. 2B is an example diagram of two bit slices after a pair of cells is swapped.

FIG. 3 is a flow diagram for swapping cells.

FIG. 4 is a flow diagram for rewiring of a bit slice.

FIG. 5 is a flow diagram for duplicating cells of a bit slice.

DETAILED DESCRIPTION OF THE INVENTION

Figure 6:
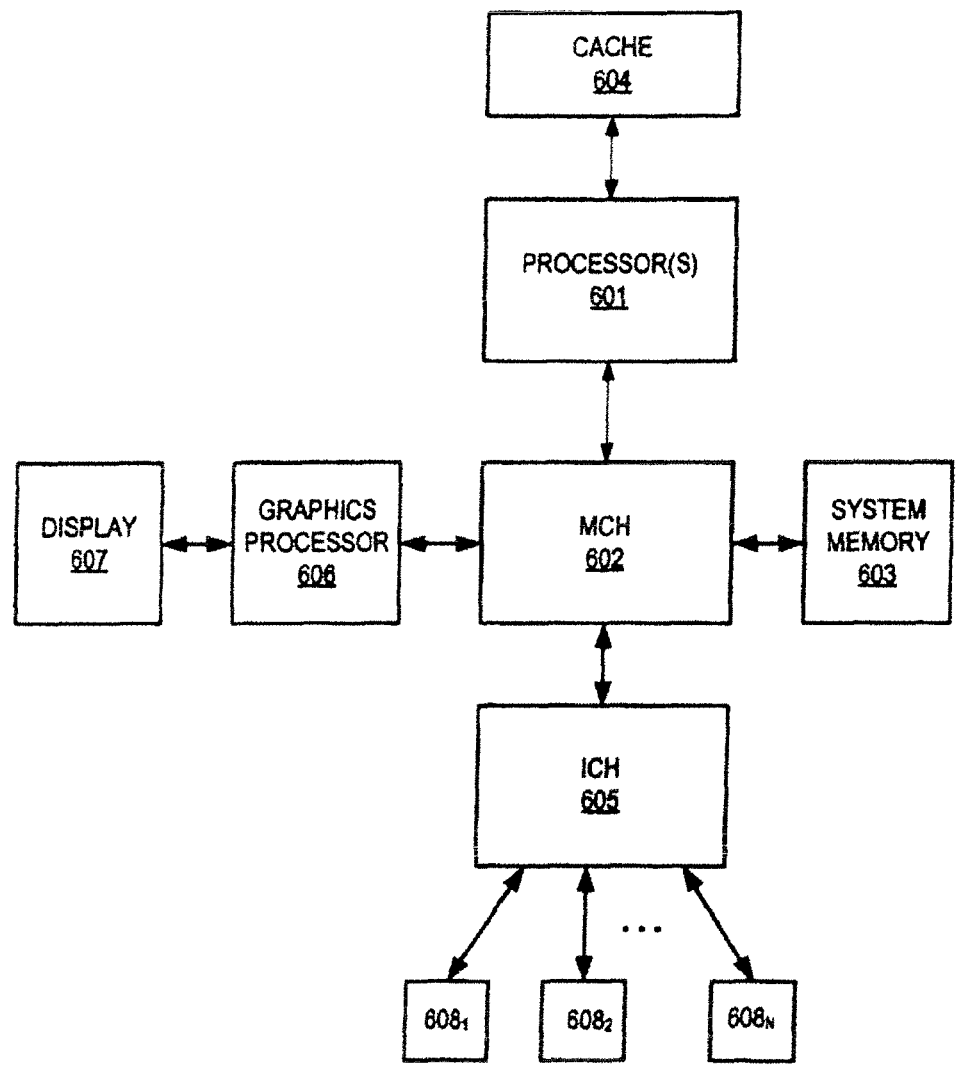
FIG. 6 is a computing system.

The objective of the invention is to provide bit slice placement and wiring so that multiple bit slices behave in a similar and optimal fashion.

FIG. 1A shows two bit slices, 110 and 120. Bit slice 110 is comprised of three cells A1, B1, and C2. Further, in this example control line Cntl1 contacts cells B1 and C2 while control line Cntl2 contacts cells B2 and C1. It is understood by those skilled in the art that other wiring lines exist contacting these cells and that other cells may exist in the bit slices. Further, the cells may be AND, OR, NOR, XOR, or other combinational or sequential logic gates. All of this information has been abstracted away so that the wiring and cells shown may be more clearly shown to display embodiments of the disclosed invention.

FIG. 1B shows the same two bit slices, 110 and 120 where cell C2 and cell B2 have had their locations swapped. After the cells have been swapped it can be seen that the two control lines, Cntl1 and Cntl2, have much less convoluted wiring arrangements.

FIG. 2A shows two example bit slices, 210 and 220. FIG. 2B shows the same two bit slices after cells F1 and G1 as well as cells F2 and G2 have been swapped. Again, it can be seen that the routing, after swapping, is much less convoluted.

FIG. 3 provides a flow chart diagram describing an embodiment for bit slice cell swapping. A circuit design is imported into a software tool or it may exist in the tool's memory from a previous operation. A bit slice within the circuit design is identified 310. Cells which comprise the bit slice are identified and listed 320. Control lines connected to the cells are identified 330. In other embodiments data lines connected to the cells may be identified. Based on the identified cells and connected control lines, cells which may be aligned are identified 340. This alignment may be desired due to convoluted wiring such as was seen in example FIGS. 1A and 2A. The identified cells are swapped 350. After swapping, Boolean equivalence is checked 360, to ensure that the function after swapping matches that function which existed prior to swapping. If the Boolean equivalence check fails, the swapping is not committed and the design is returned to its pre-swap state. Additional control lines are looked for in 330 for other possible swapping. If no possible swapping exists then the flow is exited. If the Boolean equivalence check passes, the Quality of Result (QoR) is checked 370. If the QoR is improved by the swapping the change is committed 380 and the swapping is retained in the design of the bit slice. If the QoR is not improved, further control lines and possible alignments are looked for. If no further possible alignments are identified, the routing is exited. Alternatively, if a threshold for the number of swappings has been exceeded, the routine is exited.

FIG. 4 provides a flow chart for copying wiring from one bit slice to another bit slice. A first bit slice is identified in the design 410. A second bit slice is identified in the design 420. The wiring for the second bit slice is removed 430. In some embodiments a sub-set of the wiring is removed. The second bit slice has the wiring of the first bit slice duplicated 440. After rewiring, Boolean equivalence is checked 450, to ensure that the function after rewiring matches that function which existed prior to swapping. If the Boolean equivalence check fails, the rewiring is not committed and the design is returned to its pre-swap state. Additional bit slices are looked for in 420 for other possible rewiring 465. If all possible second bit slices are examined in 420 a different start bit slice may be identified for 410 via 467. If no possible further bit slices exist then the flow may be exited. If the Boolean equivalence check passes, the Quality of Result (QoR) is checked 460. If the QoR is improved by the swapping the change is committed 470 and the swapping is retained in the design of the bit slice. If the QoR is not improved, further rewiring possibilities are looked for. If no further possible rewiring candidates are identified, the routine is exited.

FIG. 5 provides a flow chart for duplicating cells from one bit slice into another bit slice. A first bit slice is identified in the design 510. A second bit slice is identified in the design 520. The wiring for the second bit slice is removed 530. The cells of the second bit slice are removed 540. In some embodiments a subset of the wiring is removed or a subset of the cells are removed. Cells are duplicated from the first bit slice into the second bit slice 550. In some embodiments this is referred to as cloning of bit slices. The second bit slice is wired like the first bit slice 560. After cloning, Boolean equivalence is checked 570, to ensure that the function after rewiring matches that function which existed prior to swapping. If the Boolean equivalence check fails, the cloning is not committed and the design is returned to its pre-swap state. Additional bit slices are looked for in 520 for other possible rewiring 585. If all possible second bit slices are examined in 520 a different start bit slice may be identified for 510 via 587. If no possible further bit slices exist then the flow may be exited. If the Boolean equivalence check passes, the Quality of Result (QoR) is checked 580. If the QoR is improved by the swapping the change is committed 590 and the swapping is retained in the design of the bit slice. If the QoR is not improved, further rewiring possibilities are looked for. If no further possible rewiring candidates are identified, the routine is exited.

In other embodiments, multiple bit slices are generated. The bit slice results are examined to determine a preferred bit slice arrangement. This preferred bit slice is replicated a plurality of times to satisfy the design logic function requirements.

Processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.)), and/or, electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

An article of manufacture may be used to store program code. An article of manufacture that stores program code may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)).

FIG. 6 shows an embodiment of a computing system (e.g., a computer). The exemplary computing system of FIG. 6 includes: 1) one or more processors or processing cores 601; 2) a memory control hub (MCH) 602; 3) a system memory 603 (of which different types exist such as DDR RAM, EDO RAM, etc,); 4) a cache 604; 5) an I/O control hub (ICH) 605; 6) a graphics processor 606; 7) a display/screen 607; and, 8) one or more I/O devices 608.

The one or more processors/processing cores 601 execute instructions in order to perform the software routines the computing system implements. The instructions frequently involve some sort of operation performed upon data. Both data and instructions are stored in system memory 603 and cache 604. Cache 604 is typically designed to have shorter latency times than system memory 603. For example, cache 604 might be integrated onto the same silicon chip(s) as the processor(s) and/or constructed with faster SRAM cells whilst system memory 603 might be constructed with slower DRAM cells. By tending to store more frequently used instructions and data in the cache 604 as opposed to the system memory 603, the overall performance efficiency of the computing system improves.

System memory 603 is deliberately made available to other components within the computing system. For example, the data received from various interfaces to the computing system (e.g., keyboard and mouse, printer port, LAN port, modem port, etc.) or retrieved from an internal storage element of the computing system (e.g., hard disk drive) are often temporarily queued into system memory 603 prior to their being operated upon by the one or more processor(s) 601 in the implementation of a software program. Similarly, data that a software program determines should be sent from the computing system to an outside entity through one of the computing system interfaces, or stored into an internal storage element, is often temporarily queued in system memory 603 prior to its being transmitted or stored.

The ICH 605 is responsible for ensuring that such data is properly passed between the system memory 603 and its appropriate corresponding computing system interface (and internal storage device if the computing system is so designed). The MCH 602 is responsible for managing the various contending requests for system memory 603 access amongst the processor(s) 601, interfaces and internal storage elements that may proximately arise in time with respect to one another.

One or more I/O devices 608 are also implemented in a typical computing system. I/O devices generally are responsible for transferring data to and/or from the computing system (e.g., a networking adapter); or, for large scale non-volatile storage within the computing system (e.g., hard disk drive). ICH 605 has bi-directional point-to-point links between itself and the observed I/O devices 608.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A computer-implemented method for wiring of bit slices, the method comprising:
    examining a plurality of bit slices to identify a first bit slice with a preferred bit slice arrangement and identifying control lines coupled to cells within the first bit slice, using one or more processors;
    identifying, based on the identified control lines, respective cells within a second bit slice having same or similar function to the cells within the first bit slice for alignment with respective cells within the first bit slice;
    disconnecting one or more wires of the second bit slice; and
    duplicating a wire from the first bit slice into the second bit slice.

2. The method of claim 1 further comprising cloning of bit slices by performing the following:
    removing wiring for the second bit slice;
    removing cells for the second bit slice;
    copying cells from the first bit slice to the second bit slice; and
    copying wiring from the first bit slice to the second bit slice.

3. The method of claim 2 further comprising performing a Boolean equivalence check on the second bit slice.

4. The method of claim 3 further comprising returning the second bit slice to its state before the disconnecting and the duplicating when the Boolean equivalence check fails.

5. The method of claim 3 further comprising determining a Quality of Result metric on the bit slice once the Boolean equivalence check passes.

6. The method of claim 1 further comprising swapping locations for a pair of cells in the first bit slice wherein the pair of cells are connected to different control lines.

7. The method of claim 6 wherein one of the different control lines has shorter wiring once the pair of cells are swapped.

8. The method of claim 7 further comprising performing a Boolean equivalence check on the second bit slice.

9. The method of claim 8 further comprising returning second bit slice to its original wiring when the Boolean equivalence check fails.

10. The method of claim 8 further comprising determining a Quality of Result metric on the second bit slice once the Boolean equivalence check passes.

11. The method of claim 1 further comprising performing a Boolean equivalence check on the second bit slice.

12. The method of claim 11 further comprising returning second bit slice to its original cell and wiring configuration when the Boolean equivalence check fails.

13. The method of claim 11 further comprising determining a Quality of Result metric on the second bit slice once the Boolean equivalence check passes.

14. A computer program product stored on a non-transitory computer-readable medium for wiring of bit slices, the computer program containing program code that when processed by one or more processes causes a method to be performed, the method comprising:
    examining a plurality of bit slices to identify a first bit slice with a preferred bit slice arrangement and identifying control lines coupled to cells within the first bit slice;
    identifying, based on the identified control lines, respective cells within a second bit slice having same or similar function to the cells within the first bit slice for alignment with respective cells within the first bit slice;
    disconnecting one or more wires of the second bit slice; and
    duplicating a wire from the first bit slice into the second bit slice.

15. The computer program product of claim 14 wherein the method further comprises cloning of bit slices by performing the following:
    removing wiring for the second bit slice;
    removing cells for the second bit slice;
    copying cells from the first bit slice to the second bit slice; and
    copying wiring from the first bit slice to the second bit slice.

16. The computer program product of claim 15 wherein the method further comprises:
    performing a Boolean equivalence check on the second bit slice; and,
    returning the second bit slice to its state before the disconnecting and the duplicating when the Boolean equivalence check fails.

17. A computer system for wiring of bit slices comprising:
    a memory for storing instructions;
    one or more processors coupled to the memory wherein the instructions, when processed by the one or more processors, cause the one or more processors to:
    identify a first bit slice and identify control lines coupled to cells within the first bit slice;
    identify, based on the identified control lines, respective cells within a second bit slice having same or similar function to the cells within the first bit slice for alignment with respective cells within the first bit slice, wherein the identified control lines coupled to the cells within the second bit slice;
    disconnect one or more wires of the second bit slice while maintaining the cells within the second bit slice and wiring of the identified control lines to the cells within the second bit slice; and
    duplicate a wire from the first bit slice into the second bit slice.

18. The computer system of claim 17 wherein the instructions further cause the one or more processors to
    perform a Boolean equivalence check on the second bit slice; and, return the second bit slice to its state before the disconnecting and the duplicating when the Boolean equivalence check fails.

* * * * *